(12) United States Patent
Mikami

(10) Patent No.: US 7,941,720 B2
(45) Date of Patent: May 10, 2011

(54) SCAN TEST CIRCUIT AND SCAN TEST CONTROL METHOD

(75) Inventor: Kiyoshi Mikami, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 233 days.

(21) Appl. No.: 12/081,929

(22) Filed: Apr. 23, 2008

(65) Prior Publication Data

US 2008/0270859 A1    Oct. 30, 2008

(30) Foreign Application Priority Data

Apr. 27, 2007    (JP) .................................. 2007-120178

(51) Int. Cl.
*G01R 31/3177* (2006.01)
*G01R 31/40* (2006.01)

(52) U.S. Cl. ........................................ 714/731; 714/727

(58) Field of Classification Search ...................... None
See application file for complete search history.

(56) References Cited

U.S. PATENT DOCUMENTS

| 7,155,649 | B2 * | 12/2006 | Nakao et al. .................. 714/726 |
| 2002/0162065 | A1 * | 10/2002 | Kashiwagi ..................... 714/726 |
| 2003/0080750 | A1 * | 5/2003 | Parker et al. .................. 324/537 |
| 2005/0235184 | A1 * | 10/2005 | Yamauchi ..................... 714/726 |

FOREIGN PATENT DOCUMENTS

JP    2004-294424    10/2004

* cited by examiner

*Primary Examiner* — Cynthia Britt
*Assistant Examiner* — Dipakkumar Gandhi
(74) *Attorney, Agent, or Firm* — McGinn IP Law Group PLLC

(57) ABSTRACT

A scan test circuit in the present invention includes a control FF for inputting a control signal, and a scan path chain configured of scan storage elements to operate in a shift operation mode when an output of the control FF is a first status value, and in a normal operation mode when the output is a second status value. When the control signal is switched from the first status value to the second status value, the control FF outputs the second status value to multiple scan storage elements synchronously with a first clock pulse, after the switching, of a clock provided to multiple scan storage elements. When the scan control signal is switched from the second status value to the first status value, the control FF outputs the first status value to multiple scan storage elements at a timing of the control signal switching.

11 Claims, 10 Drawing Sheets

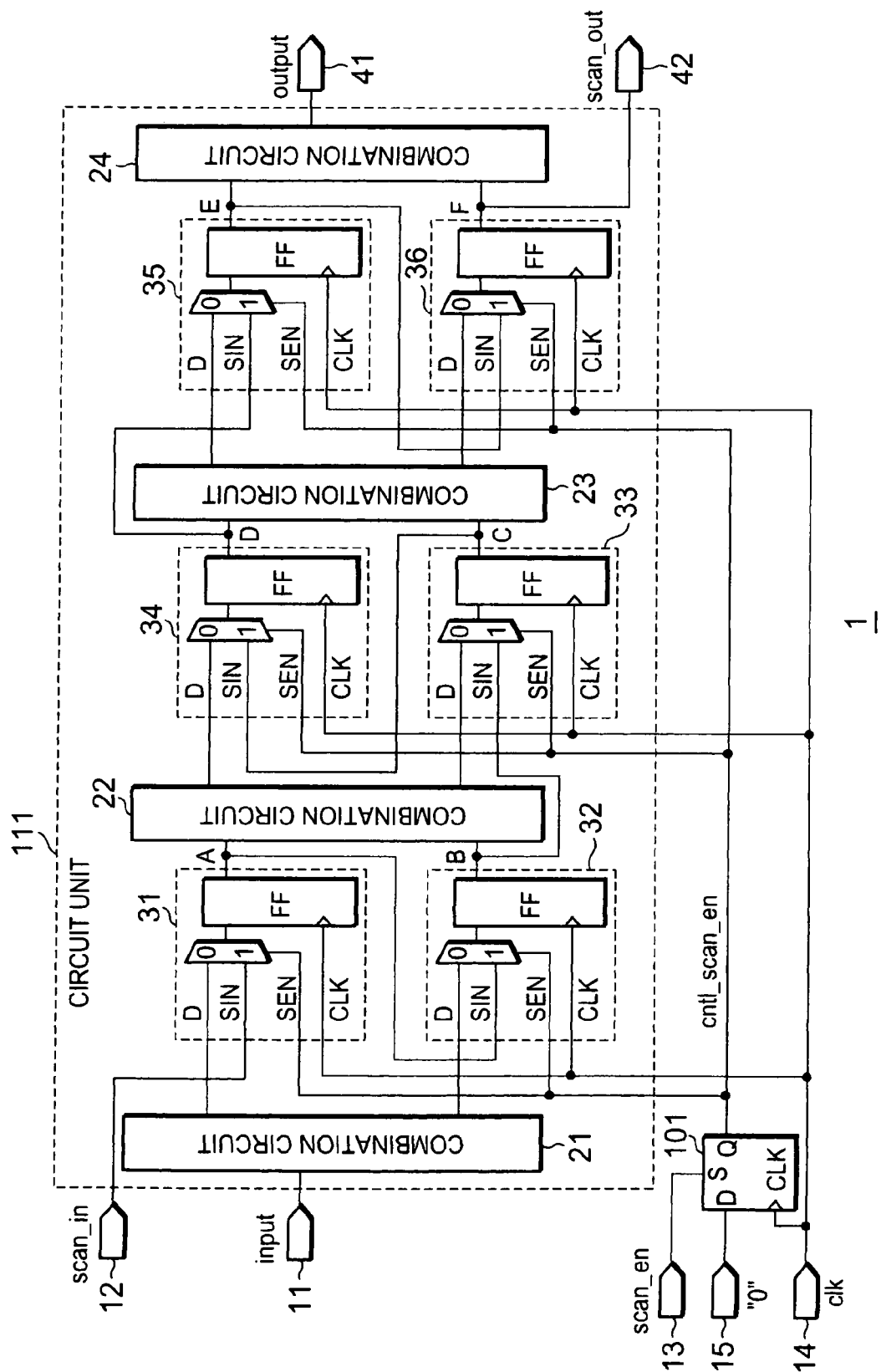

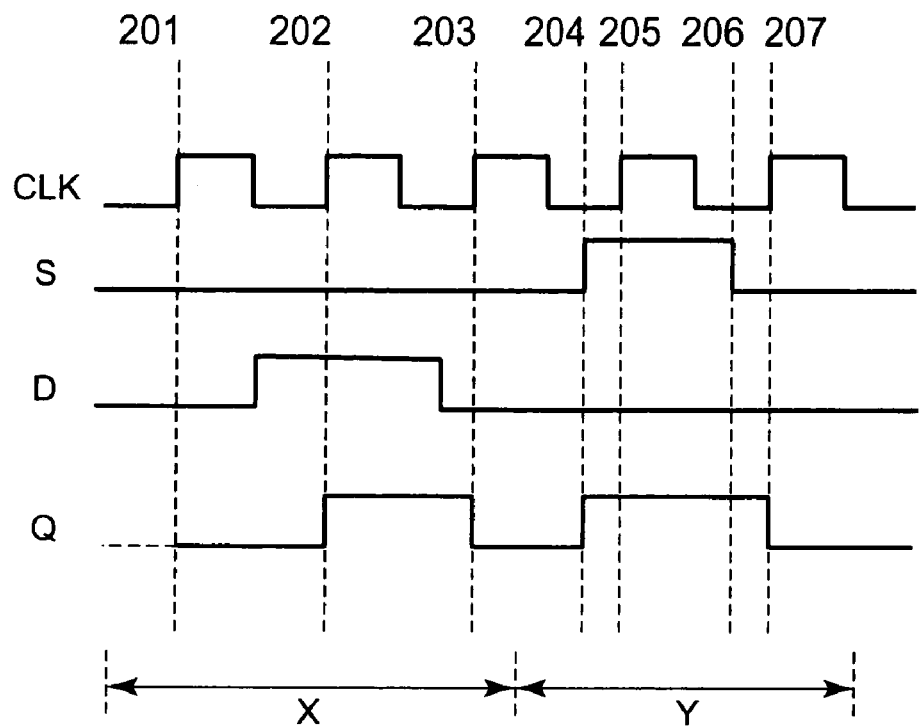

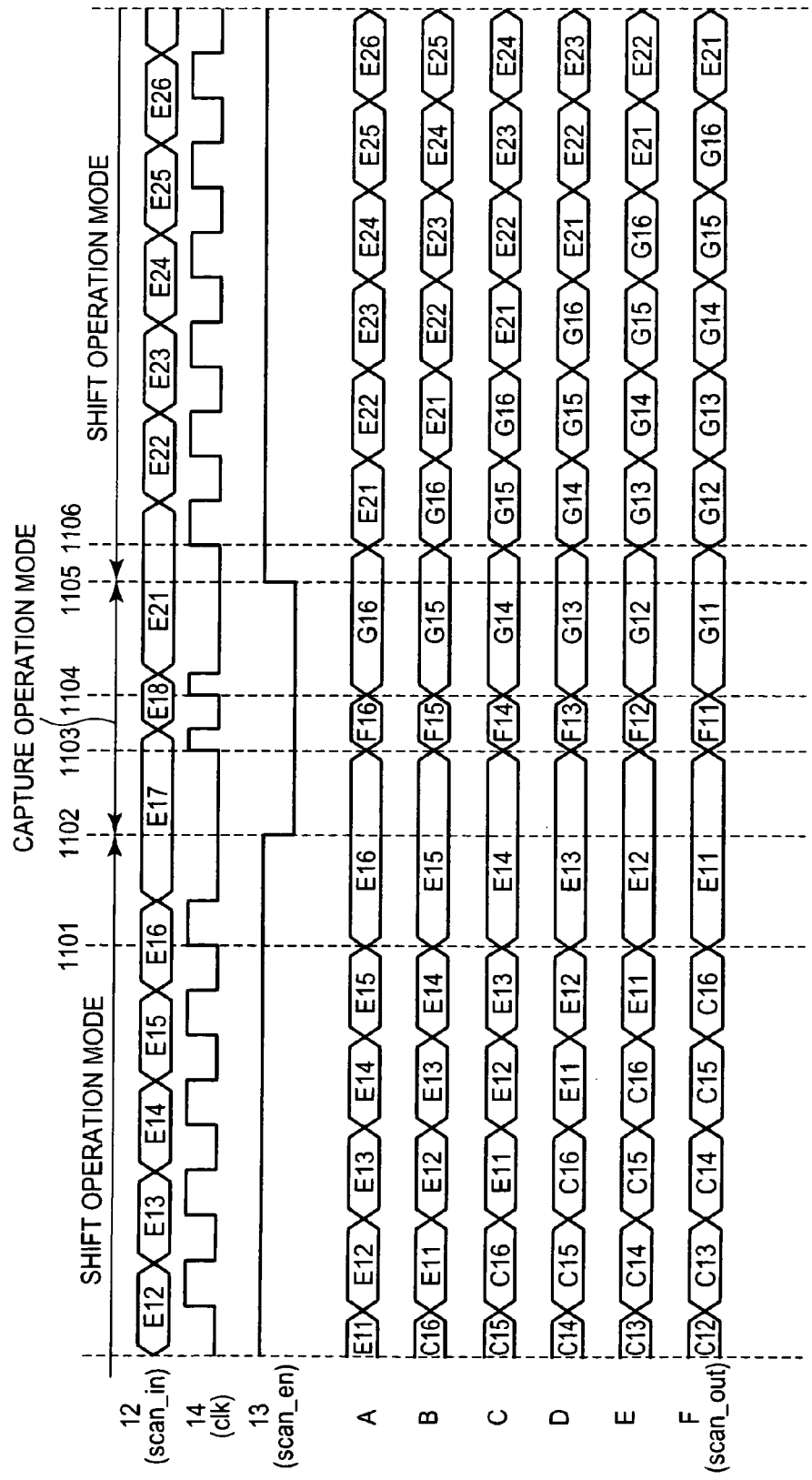

SCAN TEST CIRCUIT AND SCAN TEST CONTROL METHOD

BACKGROUND OF THE INVENTION

1. Field of the Invention

The present invention relates to a scan test circuit for detecting a stuck-at fault and a delay fault which occur in a semiconductor integrated circuit.

2. Description of the Related Art

In recent years, integrated circuits, such as an LSI, have been attaining higher operation speeds and highly integrated configurations. Against such a background, semiconductor integrated circuits conventionally manufactured are subjected to a delay test (or an actual rate test) for examining whether they operate at a desired operation frequency as well as a function test for examining whether they operate to function as desired.

As one of the delay test methods for the semiconductor integrated circuit, a delay test method employing a scan test circuit, which is used in a function test, has been conventionally carried out. Hereinafter, the outline of the delay test using the scan test circuit is described by referring to FIGS. 8 to 11. FIG. 8 shows a configuration example of a conventional scan test circuit. FIG. 9 shows a configuration example of the scan storage elements in FIG. 8. FIG. 10 is a timing chart of a function test for the conventional scan test circuit in FIG. 8. FIG. 11 is a timing chart of a delay test for the conventional scan test circuit in FIG. 8.

As shown in FIG. 8, the scan test circuit is incorporated into a semiconductor integrated circuit 1, which includes combination circuits, sequential circuits and the like, in order to obtain desired functions. The conventional scan test circuit has a structure of a shift register. Specifically, in this shift register, a part or all of the sequential circuits of the semiconductor integrated circuit 1 are replaced with scan storage elements 31 to 36, and the replaced scan storage elements 31 to 36 are serially connected to each other so that the outputs of the preceding scan storage elements may be inputted to the following scan storage elements. To be more specific, a scan flip-flop 58, which includes a delay flip-flop (hereinafter referred to as a D-FF) and a selector 55 shown in FIG. 9, and other similar circuits are generally used for the scan storage elements 31 to 36. The scan flip-flop 58 includes a data terminal (D) 51, a scan-in terminal (SIN) 52, a scan enable terminal (SEN) 53 and a clock terminal (CLK) 54. An input value from the data terminal 51 or the scan-in terminal 52 is inputted to the D-FF 56 in accordance with a setting value of a scan enable signal (scan_en) assigned to the scan enable terminal 53.

The scan storage element 31 located in the first stage of the shift register receives an input from a scan-in terminal 12, while the scan storage element 36 located in the last stage sends the outputs to a scan-out terminal 42. A scan path chain (or a scan path) is thus formed by the scan-in terminal 12, the scan storage elements 31 to 36, and the scan-out terminal 42. Here, such a connection forming the scan path is referred to as scan connection, and the number of scan storage elements forming the scan path or the shift register is referred to as scan length. In the example illustrated in FIG. 8, a total of six scan storage elements 31 to 36 gives a scan length of 6-bits.

Each of the scan storage elements 31 to 36 selects either an input through the scan path or an input from a corresponding one of combination circuits 21 to 23 according to the scan enable signal (scan_en) inputted to a scan enable signal input terminal 13. Thus, in the conventional scan test circuit, it is possible to switch between a shift operation mode and a capture operation mode according to the scan enable signal (scan_en). In the shift operation mode, the scan path described above is activated, while, in the capture operation mode, the sequence circuits capture the outputs from the combination circuits. Note that, the capture operation mode is also a normal operation mode (normal mode) of the semiconductor integrated circuit 1.

The operations during the function test of the scan test circuit thus constructed are as follows. First, the scan enable signal input terminal 13 is set to "1" (a shift operation mode), and scan data is inputted from the scan-in terminal 12 in synchronization with a clock (clk) applied from a clock terminal 14 to the scan storage element 31. Thus, initial values of the scan storage elements 31 to 36 are set for a scan test. The number of clock pulses of the inputted clock is the same as that of the scan storage elements 31 to 36 which forms the scan path. In FIG. 10, the setting of the initial values is completed by the clock application at a timing 1001.

Next, after the setting of the initial values, the scan enable signal input terminal 13 is set to "0" (a normal mode), a clock pulse is applied once more (at a timing 1002). Then, a capture operation is performed in which calculation results of the combination circuits obtained on the basis of the initial values are stored in the scan storage elements 31 to 36. Lastly, the operation mode is switched back to the shift operation mode, and the calculation results are taken out of the semiconductor integrated circuit 1 while the clock (clk) is applied. The calculation results are compared with predetermined expected values in order to perform the function test for semiconductor integrated circuit 1. In FIG. 10, the results are sequentially outputted after the timing 1003.

In the function test described above, a data delay of the scan path is generally longer than the time of one operation clock cycle of the semiconductor integrated circuit 1. For this reason, the functional test cannot be performed at an operation speed desired for the semiconductor integrated circuit 1. In addition, the time required for supplying the scan storage elements with the scan enable signal, which is used to switch between the shift operation mode and the capture operation mode, is also generally longer than the time of one operation clock cycle of the semiconductor integrated circuit 1. Hence, the conventional function test is carried out at an operation frequency lower than the actual operation frequency of the semiconductor integrated circuit.

As described above, since it takes time to set the initial values by using the scan test circuit which operates only at a lower operation frequency, the combination circuits complete the calculations by the time the setting of the initial values is completed. Consequently, it is not possible to perform the test to examine whether the calculations can be performed (calculation operation) at a desired speed by the combination circuits 21 to 24 provided between the scan storage elements 31 to 36.

Thus, as shown in FIG. 11, a delay test is performed by applying a clock pulse twice at a clock frequency of a desired operation speed during the capture operation. In this test, first calculation results of the combination circuits 21 to 23 are stored in the scan storage elements 31 to 36 in response to a first clock application (at a timing 1103) during the capture operation, and then second calculation results based on the first calculation results are stored in the scan storage elements 31 to 36 in response to a second clock application (at a timing 1104). In this way, in response to the second clock application, the calculation results of the combination circuits 21 to 23 are stored in the scan storage elements 31 to 36. This is considered to be equivalent to a result of the operation of the semiconductor integrated circuit 1 at the desired operation speed. Therefore, the delay test is performed by comparing the calculation results with predetermined expected values. Note that, in the function and delay tests, the clock used to store the calculation results of the combination circuits, which are the test results, in the scan storage elements is called a capture clock, and the clock use to output the original data for the calculations to be performed by the combination circuits is called a launch clock. Thus, in the delay test, such as the one shown in FIG. 11, the first clock applied at the timing 1103 is a launch clock and the second clock applied at the timing 1104 is a capture clock.

A different technology of the test circuit for performing a delay test for a semiconductor integrated circuit is described in Japanese Patent Application Publication No. 2004-294424.

As described above, in the function test, initial values of the scan storage elements 31 to 36 are set by the scan test circuit, and then the calculation results of the combination circuits 21 to 24 obtained with one clock application are compared with the predetermined expected values. In the meantime, in the delay test method using the conventional scan test circuit, the calculation results of the combination circuits 21 to 24 obtained after two clock applications are compared with the predetermined expected values. Accordingly, the function test and the delay test in a delay test method using the conventional scan test circuit require different data sets for fault detection (or such data set is simply referred to as a test pattern) consisting of the setting values for the scan storage elements and the predetermined expected values of the calculation results. Therefore, a more complicated preparation is necessary to generate the data set for fault detection in the delay test, due to, for example, necessity of acquiring expected values after two clock applications.

Furthermore, in Japanese Patent Application Publication No. 2004-294424, a scan control circuit generates a scan selection internal signal line and a scan clock (including the launch clock and the capture clock) from three input signals, including a scan selection signal, a normal operation clock and a test clock. This configuration complicates the circuits forming the internal structure of the scan control circuit.

SUMMARY OF THE INVENTION

A scan test circuit according to the present invention includes: a control flip-flop inputting a scan control signal; and a scan path chain, which is formed by multiple scan storage elements serially connected to each other, operating in a first mode for performing a shift operation when an output of the control flip-flop is a first status value, and operating in a second mode for performing a normal operation when an output of the control flip-flop is a second status value. The control flip-flop is characterized as follows. When the scan control signal is switched from the first status value to the second status value, the control flip-flop outputs the second status value in synchronization with a first clock pulse, after the switching, of a clock provided to the multiple scan storage elements. When the scan control signal is switched from the second status value to the first status value, the control flip-flop outputs the first status value to the multiple scan storage elements at a timing of the switching of the scan control signal.

According to the scan test circuit of the present invention, it is possible to use a test pattern for delay fault detection, which does not require multiple combination circuits, in a delay fault test, by using a control flip-flop, such as a set flip-flop, in which an output is controlled in asynchronization with an input clock.

According to the present invention, efficiency of a test pattern for detection of delay fault used in a scan test is increased, and therefore the test pattern length for detection of delay fault can be reduced in a simple circuit structure.

BRIEF DESCRIPTION OF THE DRAWINGS

FIG. 1 shows a configuration example of a scan test circuit according to a first embodiment.

FIG. 2 shows an example of a timing chart of a control flip-flop of the scan test circuit according to the first embodiment.

FIG. 3 shows an example of a truth table of the control flip-flop of the scan test circuit according to the first embodiment.

FIG. 11 shows an example of a timing chart of the scan test circuit according to a second conventional technique.

DESCRIPTION OF THE PREFERRED EMBODIMENTS

First Embodiment

Figure 4:
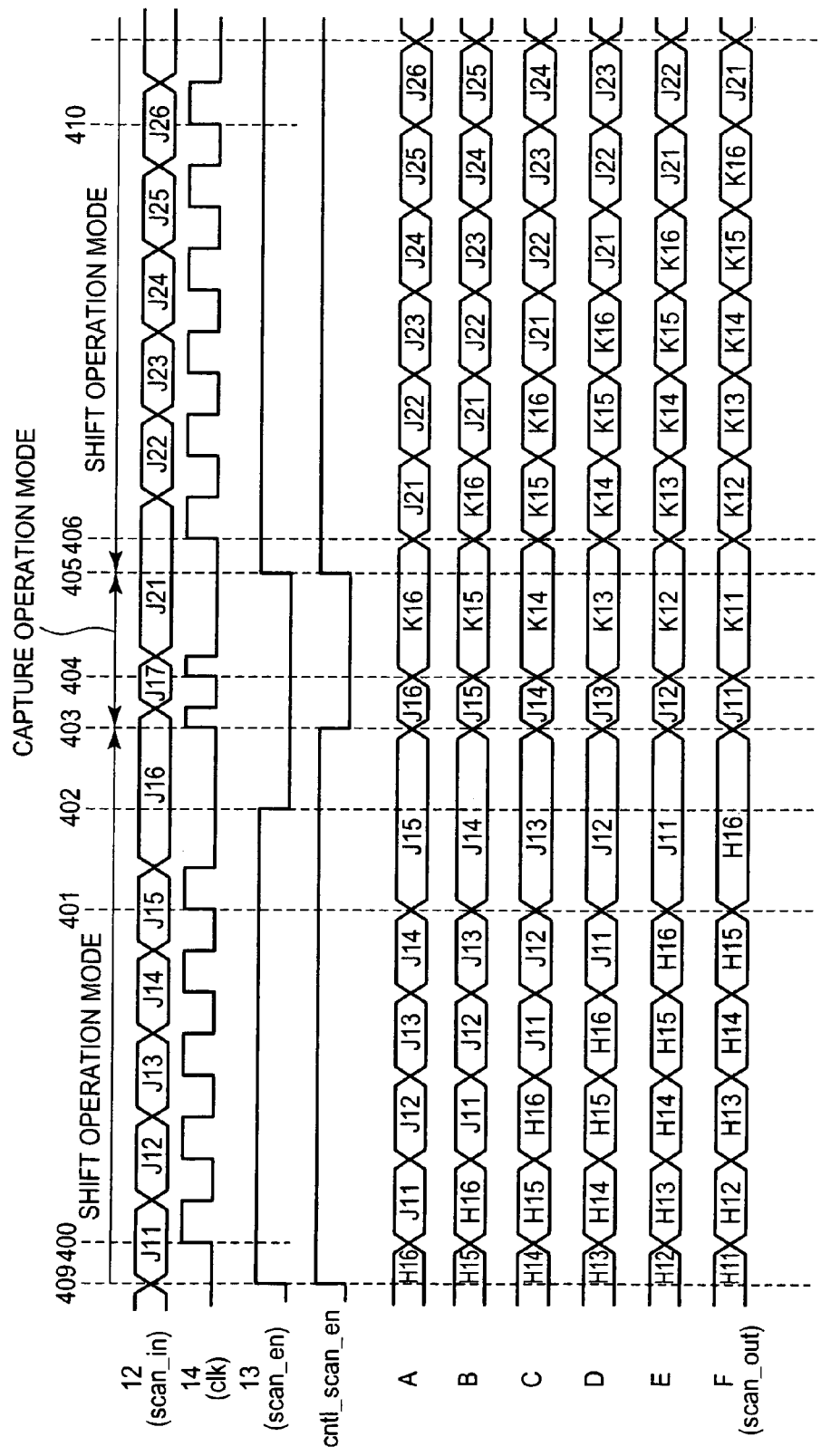
FIG. 4 shows an example of a timing chart of the scan test circuit according to the first embodiment.

Hereinafter, a first embodiment in which the present invention is adopted will be described in detail with reference to the drawings.

FIG. 1 shows a configuration example of a scan test circuit according to the first embodiment. In the description of the drawing, the structures denoted by the same reference numerals as those in FIG. 8 have the same or similar structures in FIG. 8.

In the present embodiment, the scan test circuit of the present invention is provided in the semiconductor integrated circuit 1 including combination circuits 21 to 24, sequence circuits, such as a flip-flop, a clock terminal 14, an input terminal 11 and an output terminal 41, for the purpose of achieving a desired function. In the present case, a circuit including all the combination circuits 21 to 24 and the sequence circuits, such as the flip-flop, is defined as a circuit unit 111.

The clock terminal 14 externally inputs a clock signal which causes the semiconductor integrated circuit 1 to operate, and also inputs a test clock during test using the scan test circuit of the present invention It should be noted that the test clock in test operation using the scan test circuit is provided by a semiconductor tester or the like from the outside of the semiconductor integrated circuit 1. Accordingly, the semiconductor tester or the like modulates a timing of a clock applied, pulse width and the like according to a setting of the scan test circuit. The semiconductor tester and the like provide test patterns for the test, as will be described later, and also perform a comparison with expected values and the like.

Note that the input terminal 11 and the output terminal 14 are external terminals of the semiconductor integrated circuit 1.

The semiconductor integrated circuit 1 is provided with external terminals, including a scan enable signal input terminal 13, a scan-in terminal 12 and a scan-out terminal 42, for the scan test circuit of the present embodiment.

Figure 9:
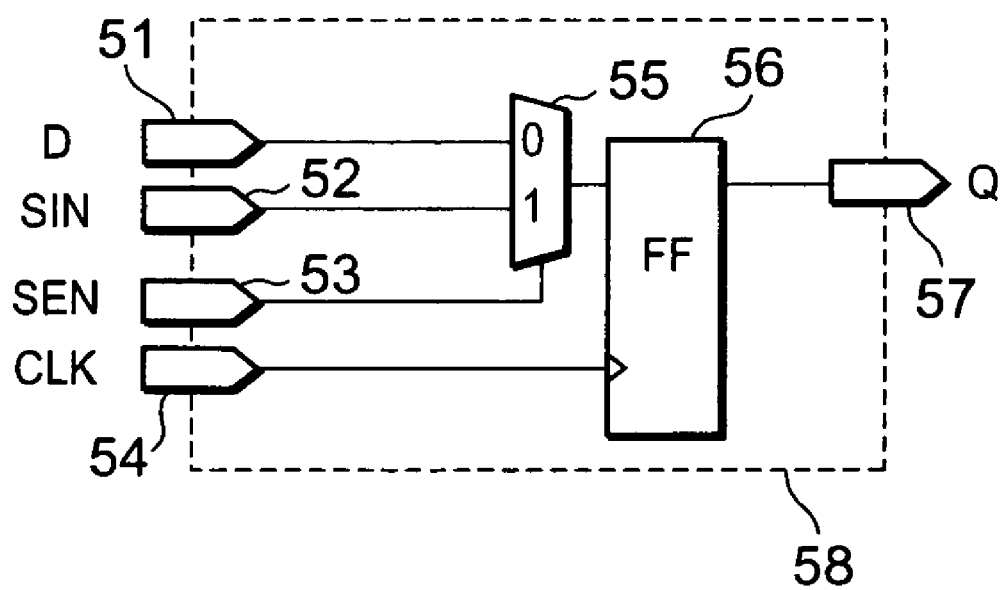
FIG. 9 shows a configuration example of a scan storage element in the configuration of the scan test circuit according to the conventional technique.
Figure 10:
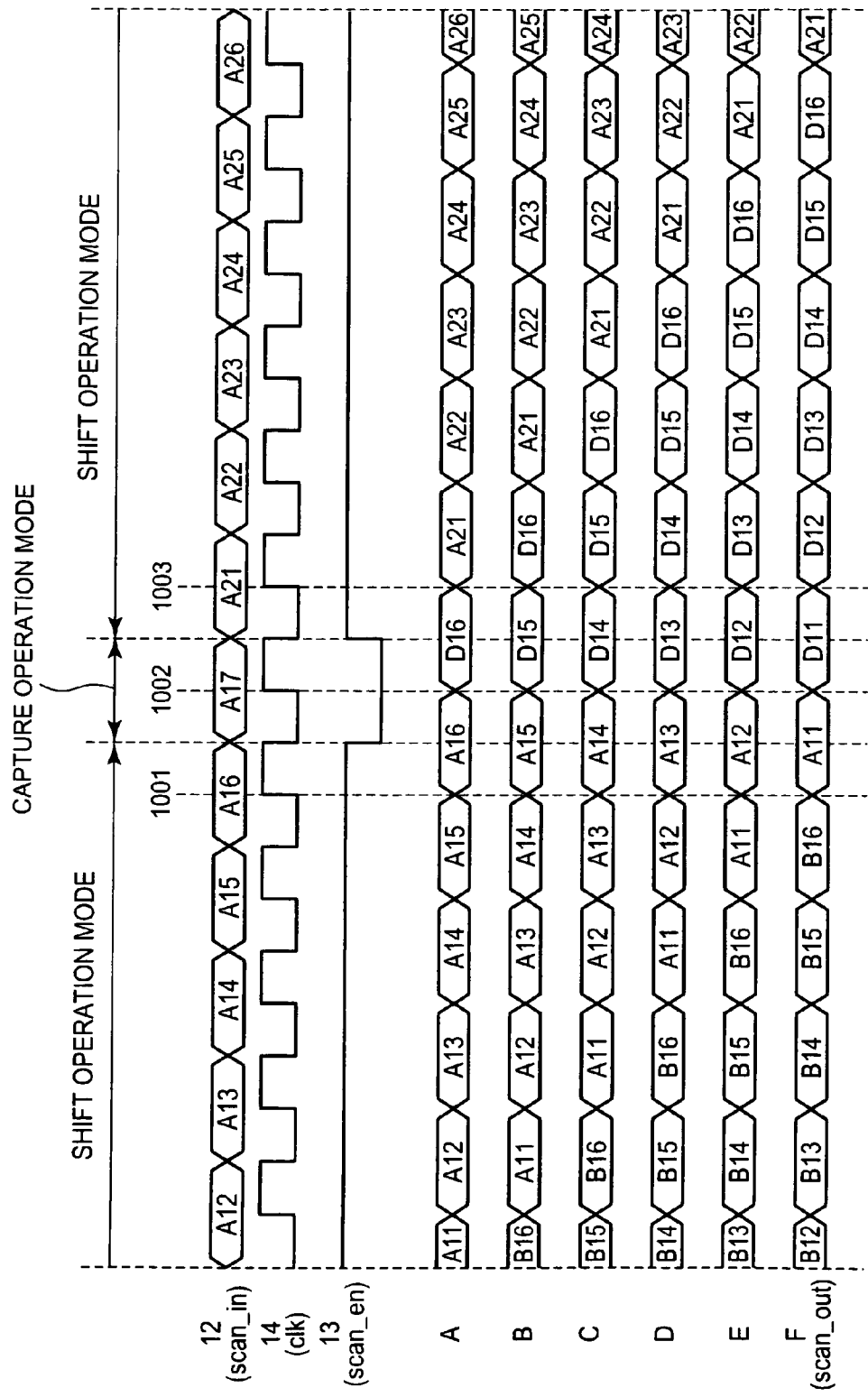
FIG. 10 shows an example of a timing chart of the scan test circuit according to a first conventional technique.

The sequence circuits are replaced with scan flip-flops shown in FIG. 9 for scan test, and the scan flip-flops are incorporated as the scan storage elements 31 to 36. A connection is established such that calculation results from the combination circuits 21 to 24 are inputted to data terminals (D) of the scan storage elements 31 to 36.

Figure 8:
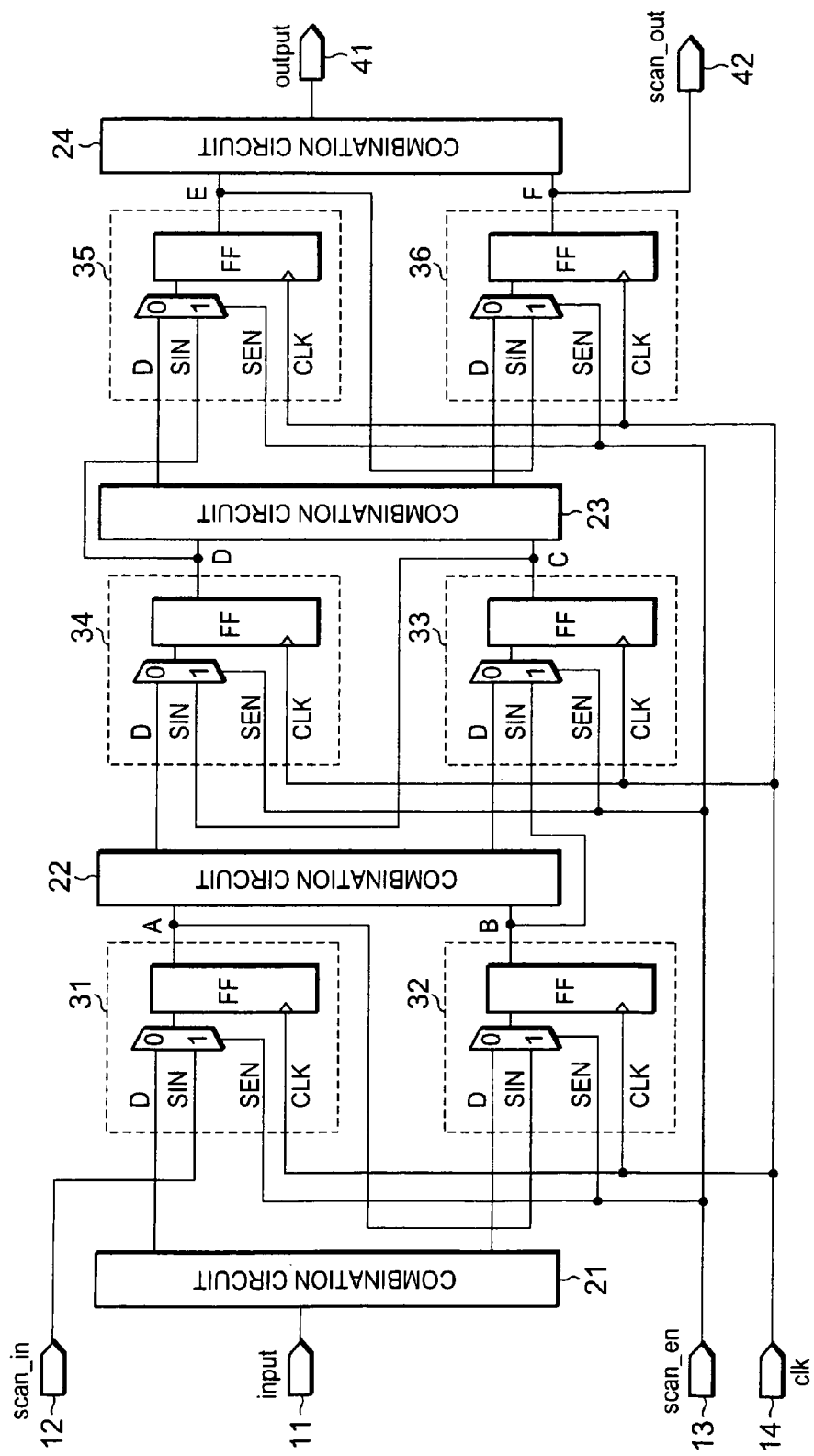
FIG. 8 shows a configuration example of a scan test circuit according to a conventional technique.

Meanwhile, the scan storage elements 31 to 36 form a scan path similar to that in FIG. 8. In this formation, each of scan-in terminals (SIN) of the scan storage elements 31 to 36 is connected to an output terminal (Q) of the scan storage element located in the preceding stage. It should be noted that the scan-in terminal (SIN) of the scan storage element 31 located in the first stage of the scan path is connected to the scan-in terminal 12 which is the external terminal of the semiconductor integrated circuit 1, while the output terminal (Q) of the scan storage element 36 located in the last stage of the scan path is connected to the scan-out terminal 42 which is the external terminal of the semiconductor integrated circuit 1. Incidentally, the scan length of the scan test circuit of the present embodiment is also 6-bits as in FIG. 8.

The scan test circuit according to the first embodiment shown in FIG. 1 is further provided with a control flip-flop 101, which is a set flip-flop, as compared with the conventional scan test circuit shown in FIG. 8. It should be noted that the set flip-flop in this specification, as will be described later, is a flip-flop that sets its output independently (asynchronously) from a clock provided to this flip-flop. In this case, the term "to set" indicates that the output value (particularly a positive output) is set to a logic value "1".

The control flip-flop 101, which is a set flip-flop, used in the present embodiment includes a set terminal (S), the data input terminal (D), a clock input terminal (CLK) and the data output terminal (Q) as shown in FIG. 1. The set terminal (S), the data input terminal (D) and the clock input terminal (CLK) of the control flip-flop 101 are connected to the scan enable signal input terminal 13, the clock terminal 14 and an external input terminal 15, respectively. In addition, the data output terminal (Q) of the control flip-flop 101 is connected to each of the scan enable signal input terminals 53 (see FIG. 9) of the scan storage elements 31 to 36, and an output signal (cntl_scan_en) from the data output terminal (Q) is distributed to the scan storage elements 31 to 36. Furthermore, an input of the external input terminal 15 is fixed to "0".

The scan storage elements 31 to 36 select either the input from the combination circuits 21 to 24 or the input from the scan path according to the scan enable signal (cntl_scan_en) outputted from the control flip-flop 101. In the present embodiment, the input from the combination circuits 21 to 24 is selected when the cntl_scan_en is "0", while the scan path is selected when the cntl_scan_en is "1". Since other components are the same as those in FIG. 8, the explanation is omitted.

Here, an operation of the set flip-flop serving as the control flip-flop 101 will be described by using a timing chart shown in FIG. 2. FIG. 3 shows a truth table based on the operation of the set flip-flop serving as the control flip-flop 101.

The following can be seen in FIG. 2. At a timing 201, since the input data of the set terminal (S) and the data input terminal (D) are "0" and "1", respectively, the input data "0" of the data input terminal (D) is outputted to the data output terminal (Q) in synchronization with the rising edge of an input clock of the clock terminal (CLK). At a timing 202, since the input data of the set terminal (S) and the data input terminal (D) are "0" and "1", respectively, the input data "1" of the data input terminal (D) is outputted to the data output terminal (Q) in synchronization with the rising edge of an input clock of the clock terminal (CLK). At a timing 203, since the input data of the set terminal (S) and the data input terminal (D) are both "0", the input data "0" of the data input terminal (D) is outputted to the data output terminal (Q) in synchronization with the rising edge of an input clock of the clock terminal (CLK). At a timing 204, the input data of the set terminal (S) is "1", and therefore the data "1" is outputted to the data output terminal (Q) in asynchronization with the rising edge of an input clock of the clock terminal (CLK). At a timing 205, the input data of the set terminal (S) is "1", and therefore the data "1" is outputted to the data output terminal (Q). At a timing 206, although the input data of the set terminal (S) is "0", the clock of the clock terminal (CLK) is not at a rising edge; therefore, the data "1" is maintained and outputted to the data output terminal (Q). At a timing 207, since the input data of the set terminal (S) and the data input terminal (D) are both "0", the input data "0" of the data input terminal (D) is outputted to the data output terminal (Q) in synchronization with the rising edge of an input clock of the clock terminal (CLK) It should be noted that the operation before the timing 201 is not determined.

As described above and shown in the true table in FIG. 3, when the input data of the set terminal (S) is "1", the data "1" is outputted regardless of the input data of the data input terminal (D). However, even if the input data of the set terminal (S) is changed from "1" to "0", the data "1" is maintained until a rising edge of the clock is inputted.

In the present embodiment, the input of the data input terminal (D) of the set flip-flop serving as the control flip-flop 101 is fixed to "0", that is, "0" clamp. Accordingly, fixing the input of the data input terminal (D) to "0" in advance, the control flip-flop 101 does not operate in the condition of the range X showed in FIG. 2 and only operates in the condition of the range Y showed in FIG. 2.

In other words, when the scan enable signal (scan_en, that is, the scan control signal) provided externally from of the semiconductor integrated circuit 1 is changed from "1" (a first status value) to "0" (a second status value), the control flip-flop 101 switches the cntl_scan_en, which is distributed to the scan storage elements 31 to 36 from "1" to "0", in synchronization with the rising edge of the clock signal (clk) provided externally as well. On the contrary, when the scan enable signal (scan_en) is changed from "0" to "1", the control flip-flop 101 switches the cntl_scan_en, which is distributed to the scan storage elements 31 to 36, from "0" to "1" independently (asynchronously) from the clock signal (clk).

Next, a description will be given to an operation of the scan test circuit of the present embodiment by referring to FIGS. 4 and 5. FIG. 5 shows an enlarged part between timings 402 to 405 in FIG. 4 regarding the signals of clk, scan_en and cntl_scan_en. J11 to J16 and J21 to J26 in the drawing are scan data to be inputted from the scan-in terminal 12. J17 is a setting value of the scan-in terminal 12 in a delay test which will be described later. H11 to H16 in the drawing are data which have been stored in the scan storage elements before the initial values are set for a scan test by a scan operation. K11 to K16 in the drawing are logical operation data (calculation results) of respective combination circuits, which are inputted to the scan storage elements 31 to 36 during a capture operation mode. Furthermore, A to F in the drawing represent data observed in the nodes A to F (outputs from the scan storage elements 31 to 36), respectively. Other reference numerals represent data outputted from terminals denoted by the same reference numerals as in FIG. 1.

Figure 5:
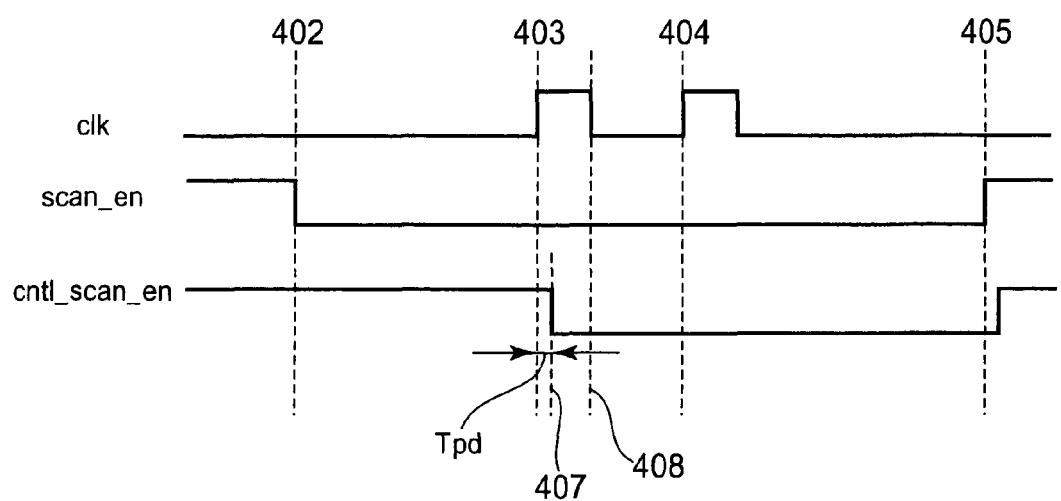
FIG. 5 shows a partially enlarged view of the timing chart shown in FIG. 4.

In the timing chart in FIG. 4, it is illustrated that a new scan test is initiated at a timing 409. At the timing 409, the values stored in the scan storage elements 31 to 36 are supposed to be H16, H15, H14, H13, H12, and H11, respectively. Thus, the nodes A to F at the timing 409 have status values of H16, H15, H14, H13, H12, and H11, respectively.

First, at the timing 409, the scan enable signal (scan_en) inputted from the scan enable signal input terminal 13 is set to "1". The scan enable signal (scan_en) is inputted to the set terminal (S) of the control flip-flop 101. Accordingly, when the scan enable signal (scan_en) is set to "1", cntl_scan_en, which is the output from the control flip-flop 101, is "1". Since the cntl_scan_en is distributed to the scan enable signal input terminals 53 of the scan storage elements 31 to 36, the scan storage elements 31 to 36 select the input through the scan path, and then the scan test circuit is switched to the shift operation mode. This switching is performed independently from the clock (clk), in other words, the switching is performed in asynchronization with the clock (clk).

From the timing 409, scan data J11 to J16 which serve as initial values for the scan test are sequentially inputted to the scan-in terminal 12 from scan storage elements 31 to 36. At first, the scan data J11 is inputted to the scan-in terminal 12, and then the scan data J11 is inputted to the scan storage element 31 by a clock application from the clock terminal 14 at a timing 400. At the same time, the data H16 to H12 held in the scan storage elements 31 to 35 are stored in the scan storage elements 32 to 36, respectively, by a shift operation. Thereafter, the scan data input from the scan-in terminal 12 and the clock application from the clock terminal 14 are alternately repeated in the same way up to a clock application at a timing 401. Upon the completion of the clock application at the timing 401, scan data J15 to J11 and H16 are stored in the scan storage elements 31 to 36, respectively. The time point of the completion of the clock application at the timing 401 corresponds to the time point when a length of one bit for data setting is left for the setting of the initial values of the scan storage elements 31 to 36. Lastly, the scan data J16 is inputted to the scan-in terminal 12, and, furthermore, the input to the scan enable signal input terminal 13 is set to "0" at a timing 402.

It should be noted that, although the input to the scan enable signal input terminal 13 is "0" at the timing 402, it is only that the set signal of the control flip-flop 101 is cancelled at this timing; thus, the value maintained by the control flip-flop 101 remains "1". Since the cntl_scan_en remains "1", the scan test circuit remains in the shift operation mode. This corresponds to the timing 206 in the timing chart of the control flip-flop 101 in FIG. 2.

Next, a clock pulse having a desired operation speed is applied to the clock terminal 14 at timings 403 and 404. Here, a clock pulse having a desired operation speed is only required to at least have the length of time difference between the timing 403 and the timing 404 same as the length of one cycle of a desired clock operation frequency of the semiconductor integrated circuit 1. The first clock pulse applied at the timing 403 serves as a launch clock, and the second clock pulse applied at the timing 404 serves as a capture clock.

When the launch clock is applied, the scan data J16 inputted to the scan-in terminal 12 is stored in the scan storage element 31, and the scan data J15 to J11 in the scan storage elements 32 to 36. Thus, at this timing, while setting of the initial values of the scan storage elements 31 to 36 for the scan test is completed, the scan storage elements 31 to 36 output (launch) the values stored therein to the combination circuits located in a following stage. The output terminal 42 outputs the scan data J11 outputted from the scan storage element 36. Furthermore, since the input of the data input terminal (D) of the control flip-flop 101 is set to "0", the cntl_scan_en outputted, in synchronization with the rising edge of the launch clock, from the data output terminal (Q) of the control flip-flop 101 is "0". This corresponds to the timing 207 in the timing chart of the control flip-flop 101 in FIG. 2

Accordingly, as the setting of the initial values of the scan storage elements 31 to 36 by the scan test circuit is completed, the inputs to the scan storage elements 31 to 36 are switched to the scan path side, and thus, the switching to the capture operation mode of the present scan test circuit is completed. Note that, the switching from "1" to "0" in synchronization with the clock signal (clk) of the cntl_scan_en is performed after the rising of the launch clock at the timing 403 before the rising of the capture clock at the timing 404. To be more specific, the switching is performed before the timing of the rising of the capture clock at the timing 404 by a length of time required for setup of the scan storage elements.

In this event, the timing (a timing 407) of a falling of the cntl_scan_en signal, which is outputted from the control flip-flop 101 and inputted to the scan storage elements 31 to 36, is actually inputted to each of the scan storage elements 31 to 36 with a delay time of Tpd shown in FIG. 5. Therefore, at the timing (the timing 403) when the rising of the launch clock is inputted to each of the scan storage elements 31 to 36, the cntl_scan_en inputted to each of the scan storage elements 31 to 36 remains to be "1". Therefore, the scan storage elements 31 to 36 operate in the shift operation mode, and store the scan data therein.

At the timing 404, although the capture clock is inputted from the clock terminal 14, the input data from the data input terminal (D) of the control flip-flop 101 is fixed to "0"; thus, the cntl_scan_en outputted from the data output terminal (Q) of the control flip-flop 101 remains to be "0". This corresponds to the timing 201 in the timing chart of the control flip-flop 101 in FIG. 2.

In other words, the scan test circuit is in the capture operation mode (a normal operation mode), and thus, the scan storage elements 31 to 36 perform the capture operation. Specifically, the output data K16 and K15 outputted from the combination circuit 21 are stored in the scan storage elements 31 and 32, respectively, in synchronization with the rising edge of the clock (the capture clock) inputted by the clock terminal 14. Similarly, the output data K14 and K13 outputted from the combination circuit 22 is stored in the scan storage elements 33 and 34, respectively, and the output data K12 and K11 outputted from the combination circuit 23 are stored in the scan storage elements 35 and 36 store, respectively.

In this case, the length of time difference between the rising edges of the launch clock and the capture clock is the same as the desired operation speed (in other words, the length of one cycle of the operation clock of the semiconductor integrated circuit 1) of the semiconductor integrated circuit 1, as described above. To be more specific, the initial values of the scan storage elements 31 to 36 are set by the launch clock, and the respective combination circuits 21 to 24 perform a calculation on the basis of the initial values. The calculation results are stored in the scan storage elements 31 to 36 by the capture clock applied after a length of time of one cycle of the operation clock of the semiconductor integrated circuit 1. Thus, the length of time from the timing 403 at which the launch clock is applied to the timing 404 at which the capture clock is applied is equivalent to the desired operation speed at which the semiconductor integrated circuit 1 is caused to operate. This is the core of the delay test.

The delay test results thus obtained are taken out of the semiconductor integrated circuit 1, and then compared with expected values. First, the scan enable signal (scan_en) inputted from the scan enable signal input terminal 13 is reset to "1" at the timing 405. By resetting the scan enable signal (scan_en) to "1", the value of the set terminal (S) of the control flip-flop 101 is set to "1"; thus, the cntl_scan_en becomes "1" independently (asynchronously) from the clock (clk) described above.

Accordingly, in the following steps, being back to the shift operation mode, the scan test circuit of the present embodiment sequentially outputs the data K11 to K16 outputted from the combination circuits 21 to 24 to be tested to the scan out terminal 42 in synchronization with the clock. Therefore, a delay test can be carried out by comparing the calculation results of the combination circuits 21 to 24; which are stored in the scan storage elements 31 to 36 by the capture clock, with expected values obtained in advance. Thus, it is possible to judge whether or not there is a delay fault in the combination circuits to be tested on the basis of the calculation results K11 to K16 of the combination circuits which have been subjected to the delay test.

Moreover, the delay test performed by this scan test circuit is performed by the following capture clock after the setting of the initial values of the scan storage elements 31 to 36 for the scan test is completed by application of the launch clock. Accordingly, same as in the function test performed by a conventional scan test circuit, the delay test performed by this scan test circuit has one state switching of the scan storage elements 31 to 36 during the time from the setting of the initial values to the acquisition of the calculation results. Therefore, a fault detection pattern (a delay test pattern) for the delay test, which is the pattern used in the scan test circuit according to this embodiment, can be created by employing a pattern generation algorithm similar to that used for the creation of the fault detection pattern (a stuck-at fault detection pattern or a function test pattern) for the function test by a conventional scan test circuit.

In some cases, a semiconductor tester or the like can perform a delay test only by modulating a timing of a clock signal or a scan enable signal with the use of the stuck-at fault detection pattern for a function test performed by a conventional scan test circuit. In such a case, the delay test pattern and the function test pattern may be almost the same. Since there is one state switching of the scan storage elements 31 to 36 from the time the setting of the initial values to the acquisition of the calculation results, it is possible to create an effective fault detection pattern, and thereby to contribute to an improvement in a fault detection rate. Moreover, the clock applications at the timings 1101 and 1103 shown in the conventional timing chart in FIG. 11 are performed by one launch clock in the present invention; thus, one less pattern is required.

Furthermore, utilization of the control flip-flop (a general set flip-flop) in which a scan enable signal controls an output asynchronously with an inputted clock eliminates the need for "a circuit independently control a first clock frequency and a second clock frequency" described in Japanese Patent Application Publication No. 2004-294424. Hence, the structure of a scan test circuit can be simplified.

In other words, the function test pattern generation algorithm of the conventional scan test can be used as the test pattern generation algorithm for delay fault detection used in the scab test circuit according to the invention. Therefore, it is possible to improve the efficiency in creation of the test pattern, to improve the detection rate, and to reduce the test pattern length for the delay fault detection in a simple circuit structure.

It should be noted that, in the present embodiment, described is the structure in which the value "0" is set for the input to the data input terminal (D) of the control flip-flop 101 by the external terminal 15 of the semiconductor integrated circuit 1; however, "0" clamp maybe set within the semiconductor integrated circuit 1.

Moreover, in the embodiment described above, the control flip-flop may be replaced with a reset flip-flop for the scan test circuit upon reversing the logic. Here, the reset flip-flop refers to a flip-flop that resets its output independently (asynchronously) from a clock. Resetting an output also refers to setting the output value (particularly a positive output) to a logic value "0". To be more specific, in the embodiment described above, it is decided that the shift operation mode is applicable if the scan enable signal is set to "1". This is only a matter of arrangement and is because the value is changeable. In other words, the scan test circuit is required to at least have the following configuration: when the operation mode is switched from the shift operation mode to the normal mode, the switching of the scan storage elements 31 to 36 or the scan path chain is performed in synchronization with the clock (clk); and when the operation mode is switched from the normal mode to the shift operation mode, the switching is performed independently (asynchronously) from the clock (clk).

In the example described above, it is shown that the switching timings 402 and 405 of the scan enable signal (scan_en) are set sufficiently far from the clock (clk) application timings 401 and 403, and 404 and 406, respectively. The switching timing 402 is set sufficiently far from the clock (clk) application timing 401 and 403 for the purposes of ensuring the storage of the shift-in data in all the scan storage elements inside the semiconductor integrated circuit in synchronization with the clock (clk) applied at the timing 401, and ensuring the input of the falling of the scan enable signal at the timing 402 into the control flip-flop. In other words, the time interval between the scan enable signal and the clock is created as a margin in order to eliminate the necessity of adjusting the timings between the clock and the scan enable signal inputted to all the scan storage elements inside the semiconductor integrated circuit. Hence, if there is no such problem in terms of delay, no such margin is needed.

Second Embodiment

Figure 6:
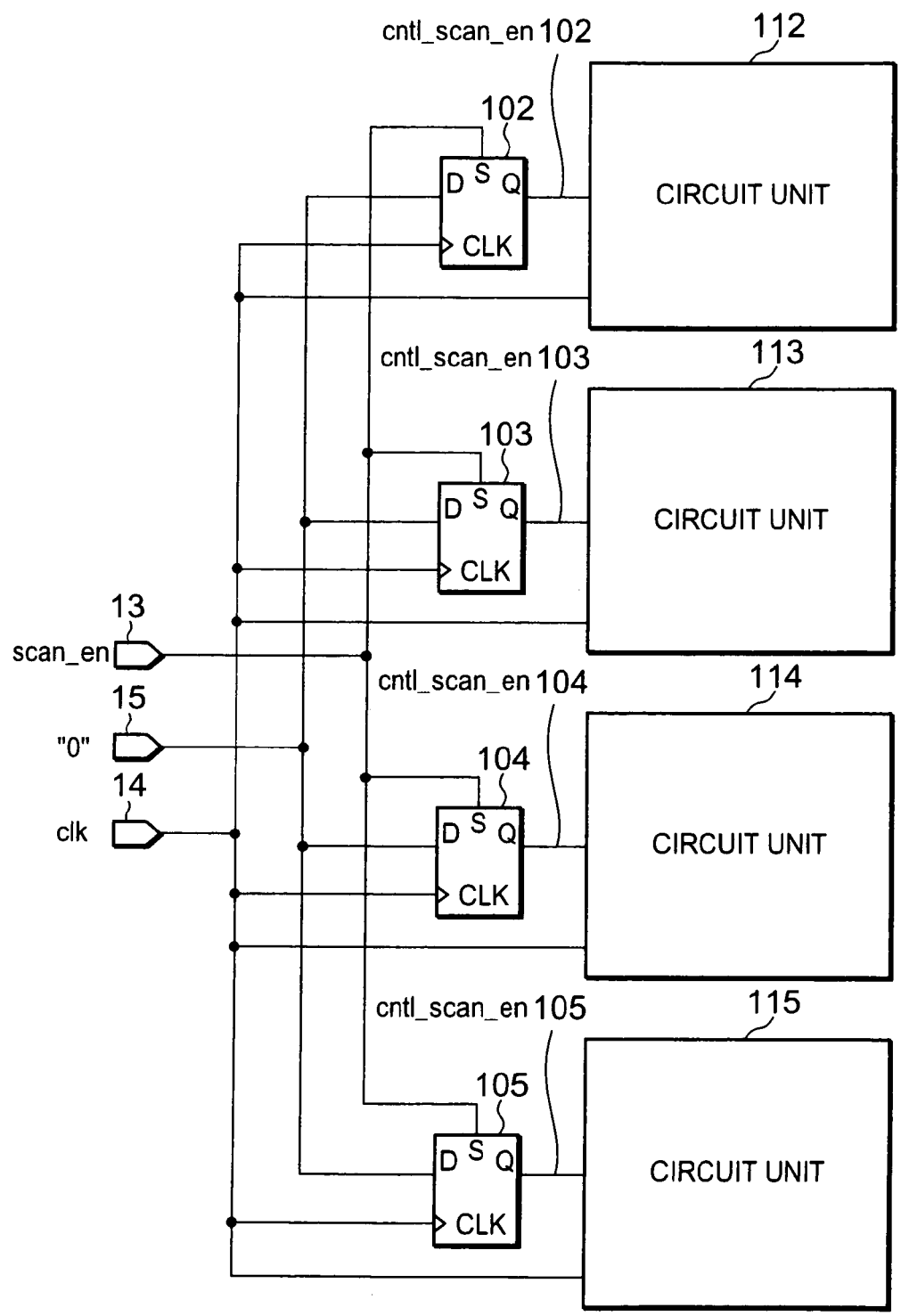
FIG. 6 shows a configuration example of a scan test circuit according to a second embodiment.

Hereinafter, a concrete second embodiment in which the present invention is adopted will be described in detail with reference to the drawings. FIG. 6 shows a configuration example of a scan test circuit according to the second embodiment. In the description of the drawings, the structures denoted by the same reference numerals as those in FIG. 1 have the same or similar structures in FIG. 1.

As shown in FIG. 6, a scan test circuit in the present embodiment includes multiple circuit units (units 112 to 115 in the present embodiment) and multiple control flip-flops (control flip-flops 102 to 105 in the present embodiment). The circuit units 112 to 115 have the similar circuit structure as that of the circuit unit 111 in the first embodiment. However, combination circuits in the circuit units are different from each other and have any structure. In addition, the control flip-flops 102 to 105 have the similar circuit structure as the control flip-flop 101 in the first embodiment. Thus, the explanation for these structures will be omitted.

Here, input and output of scan data and input of a clock to each of the circuit units may take variety of ways. For example, it may be configured that each of the circuit units is independently provided with a scan-in terminal 12, a scan-out terminal 42, and a clock terminal 14 as external terminals in a semiconductor integrated circuit 1 so that a clock signal and scan-in data are supplied to each circuit unit and scan-out data is outputted. It may be configured that multiple signals are distributed to each of the circuit units from one terminal or are selectively outputted. Furthermore, it may be configured that only one each of the scan-in terminal 12, the scan-out terminal 42, and the clock terminal 14 are provided in the semiconductor integrated circuit 1, and the scan storage elements in all the circuit units form a scan path, and a clock is supplied to all the scan storage elements. The input data to the scan-in data input terminal and the output data from the scan-out data output terminal are inputted and outputted externally as in the structure in FIG. 1, or from other circuit units. Here, when data are inputted to the scan storage elements from other circuit units during the capture operation, combination circuits 21 and 24 in FIG. 1 correspond to such other circuits units.

FIG. 6 shows a connection structure of the scan test circuit of the present embodiment. First, a scan enable signal (scan_en) inputted from a scan enable signal input terminal 13, which is an external input terminal of the semiconductor integrated circuit 1, is inputted to set terminals (S) of the control flip-flops 102 to 105. A clock signal (clk) inputted from the clock terminal 14, which is also an external input terminal, is inputted to the clock terminals (CLK) of the control flip-flops and the scan storage elements (not illustrated in the figure) in the circuit units 112 to 115. The value "0" inputted from an external input terminal 15 is inputted to data input terminals (D) of the control flip-flops. Signals cntl_scan_en 102 to 105 outputted from the data input terminals (D) of the control flip-flops are inputted to the scan storage elements (not illustrated in the figure) in the circuit units 112 to 115, respectively. Thus, the operation of the circuit units is controlled by the cntl_scan_en signal inputted to each of the circuit units, and thus, the similar operation to that of the first embodiment is performed. Consequently, a delay fault test for each of the circuit units can be performed.

As described above, the combination circuits and the sequence circuits inside the semiconductor integrated circuit are divided into multiple circuit units, and the control flip-flops control the scan storage elements which are the sequence circuits of the circuit units are connected in parallel. In this configuration, it is easily compensate the timing between the control flip-flops and the scan storage elements inside the circuit units.

In other words, as described in the first embodiment, the control flip-flops and the scan storage elements should be located closely to each other inside the semiconductor integrated circuits 1 in order to easily perform the switching from "1" to "0" in synchronization with the clock signal of the cntl_scan_en during the time from the rising of the launch clock at the timing 403 to the rising of the capture clock at the timing 404. This is because the close arrangement decreases a distribution delay of the cntl_scan_en to the scan storage elements. Therefore, the closer the control flip-flop is to the scan storage elements, the higher the effect is. However, it is not necessary to always arrange the control flip-flops close to the circuit unit as described above. As long as the above-described conditions are satisfied, the location and the number of the control flip-flops can be determined in accordance with the number of scan storage elements in the semiconductor integrated circuit 1 and the layout of the circuit.

In the second embodiment, the semiconductor integrated circuit 1 in which multiple circuit units 111 are provided is described as an example. However, the circuit unit 111 may be divided as a function unit of the semiconductor integrated circuit 1, or may rather be identified as a unit of scan storage elements to which one control flip-flop 101 distributes the cntl_scan_en than be identified as a function unit of the semiconductor integrated circuit 1.

As described above, by using the scan test circuit in the second embodiment, a delay detection test capable of providing the same effect as described in the first embodiment can be performed even in a circuit structure of a large scale semiconductor integrated circuit, such as an LSI.

Figure 7:
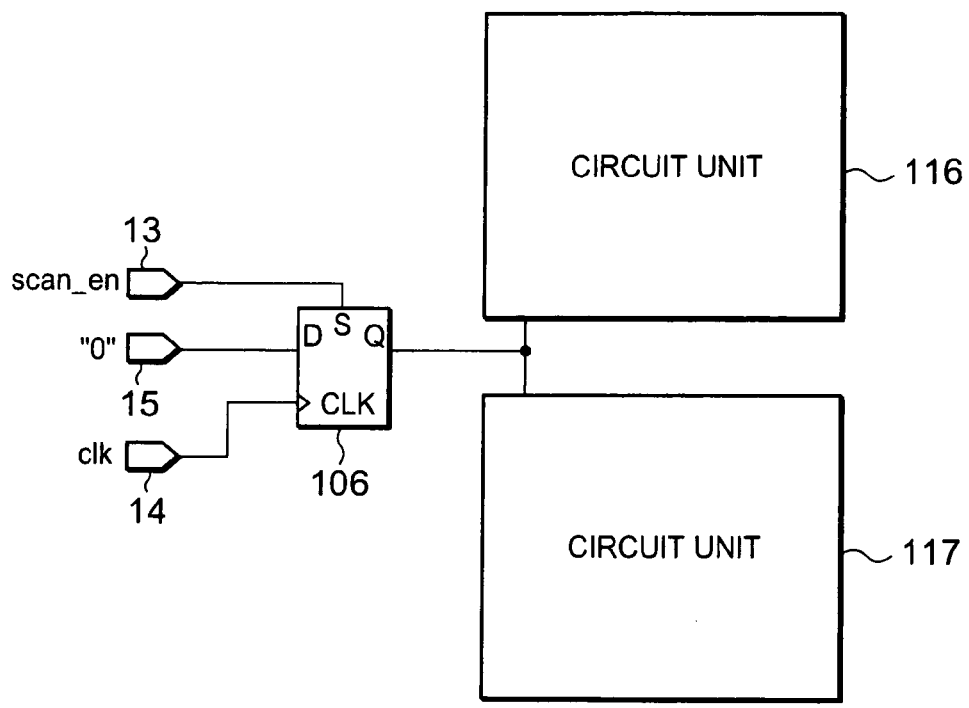
FIG. 7 shows a configuration example of a scan test circuit according to a different embodiment.

Note that, the present invention is not limited to the above embodiments and various modifications or alternations may be made accordingly within the scope of the present invention. For example, as shown in FIG. 7, one control flip-flop 106 may control multiple circuit units (circuit units 116 and 117 in the present embodiment).

Furthermore, although any figure is particularly provided, the scan test circuit in the embodiment shown in FIG. 1 may be provided with a selector (selection circuit) in a position to which the control flip-flop 101 sends the output, and be configured to switch between the cntl_scan_en and the scan enable signal (scan_en) inputted from the scan enable signal input terminal 13 by the selector, if necessary, in response to a control signal (a second scan control signal) from the control flip-flop 101. This structure in which the scan_en is selected in response to the control signal is the same as a conventional scan test circuit, and thereby can be used for the conventional tests (a function test and a conventional delay test).

As described above, one scan test circuit or multiple scan test circuits of the present invention may be provided in one semiconductor integrated circuit 1. For example, in the case where a semiconductor integrated circuit has internal circuits (circuit units), which each operate in synchronization with corresponding multiple clocks, multiple scan test circuits of the present invention can be provided respectively for internal circuits.

What is claimed is:
1. A scan test circuit, comprising:
a control flip-flop for inputting a scan control signal; and
a scan path chain formed of a plurality of scan storage elements serially connected to each other, the scan path chain performing a shift operation as a first mode when an output of the control flip-flop is a first status value, and performing a normal operation as a second mode when an output of the control flip-flop is a second status value, wherein:
an output of the control flip-flop selects an input of each of the plurality of scan storage elements,
when the scan control signal is switched from the first status value to the second status value, the control flip-flop outputs the second status value to the plurality of scan storage elements in synchronization with a first clock pulse, after the switching, of a clock provided to the plurality of scan storage elements, and,
when the scan control signal is switched from the second status value to the first status value, the control flip-flop outputs the first status value to the plurality of scan storage elements at a timing of the scan control signal switching.
2. The scan test circuit according to claim 1, wherein the control flip-flop for inputting the scan control signal:

outputs a predetermined fixed value in asynchronization with the clock when the scan control signal is the first status value, and outputs the inputted status value of the scan control signal in synchronization with the clock when the scan control signal is the second status value.

3. The scan test circuit according to claim 1, wherein the control flip-flop is provided in a plurality inside a semiconductor integrated circuit.

4. The scan test circuit according to claim 3, wherein the plurality of control flip-flops are provided close to the plurality of scan storage elements inside the semiconductor integrated circuit.

5. The scan test circuit according to claim 4, wherein
the control flip-flop includes a set terminal to which the scan control signal is inputted, and a data input terminal to which a logic value 0 is inputted.

6. The scan test circuit according to claim 1, wherein:
the control flip-flop is provided in a plurality inside a semiconductor integrated circuit,
each of the plurality of control flip-flops inputs the scan control signal, and
each of the plurality of control flip-flops supplies outputs therefrom to corresponding scan storage elements.

7. The scan test circuit according to claim 1, wherein the control flip-flop comprises a set flip-flop.

8. The scan test circuit according to claim 1, wherein the control flip-flop comprises a reset flip-flop.

9. The scan test circuit according to claim 1, further comprising:
a selection circuit provided between the output of the control flip-flop and the scan storage element, wherein
the selection circuit sends any one of the output from the control flip-flop and the scan control signal to the scan storage elements in accordance with the second control signal.

10. A semiconductor integrated circuit, comprising at least one scan test circuit according to claim 1.

11. A scan test control method for a scan test circuit having a capture operation mode for performing a normal operation and a shift operation mode for performing a shift operation, said method comprising:
switching a scan chain to the capture operation mode in response to a synchronous clock inputted to the scan chain first after a scan control signal is switched from a first status value to a second status value; and
switching the scan chain to the shift operation mode in response to a timing at which the scan control signal is switched from the second status value to the first status value.

* * * * *